United States Patent
Chen et al.

(10) Patent No.: US 8,711,601 B2
(45) Date of Patent: Apr. 29, 2014

(54) RESISTIVE RANDOM ACCESS MEMORY CELL AND RESISTIVE RANDOM ACCESS MEMORY MODULE

(75) Inventors: Frederick T. Chen, Hsinchu County (TW); Heng-Yuan Lee, Hsinchu County (TW); Yu-Sheng Chen, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 61 days.

(21) Appl. No.: 13/338,264

(22) Filed: Dec. 28, 2011

(65) Prior Publication Data
US 2013/0170278 A1      Jul. 4, 2013

(51) Int. Cl.
*G11C 11/00*  (2006.01)

(52) U.S. Cl.
USPC .......................................... 365/148

(58) Field of Classification Search
USPC .................................. 365/148, 163
See application file for complete search history.

(56) References Cited

U.S. PATENT DOCUMENTS

| | | | |
|---|---|---|---|
| 5,107,322 A | 4/1992 | Kimura | |
| 6,965,137 B2 | 11/2005 | Kinney et al. | |
| 7,830,700 B2 * | 11/2010 | Chen et al. | 365/148 |
| 7,871,866 B2 | 1/2011 | Jeong et al. | |
| 7,881,102 B2 * | 2/2011 | Nitta et al. | 365/148 |
| 8,269,205 B2 * | 9/2012 | Kubo et al. | 365/148 |
| 8,289,751 B2 * | 10/2012 | Tian et al. | 365/148 |
| 8,431,920 B2 * | 4/2013 | Kamata et al. | 365/148 |
| 2007/0090444 A1 | 4/2007 | Park et al. | |
| 2009/0117697 A1 | 5/2009 | Park et al. | |
| 2010/0163823 A1 | 7/2010 | Sim et al. | |

FOREIGN PATENT DOCUMENTS

TW      201009422      3/2010

* cited by examiner

*Primary Examiner* — Trong Phan
(74) *Attorney, Agent, or Firm* — Jianq Chyun IP Office (57) ABSTRACT

A resistive random access memory (RRAM) cell including a first electrode, a second electrode, and a plurality of repeated sets of layers is provided. Each of the sets of layers includes a resistance-changing layer, a barrier layer, and an ionic exchange layer between the resistance-changing layer and the barrier layer, wherein a thickness of each of the resistance-changing layer, the barrier layer and the ionic exchange layer exceeds a Fermi wavelength, and the thickness each of the resistance-changing layer and ionic exchange layer are less than an electron mean free path. Further, a RRAM module including the aforesaid RRAM cell and a switch is also provided.

26 Claims, 7 Drawing Sheets

RESISTIVE RANDOM ACCESS MEMORY CELL AND RESISTIVE RANDOM ACCESS MEMORY MODULE

BACKGROUND OF THE DISCLOSURE

1. Field of the Disclosure

The present disclosure relates to a resistive random access memory (RRAM) cell and RRAM module. More particularly, the present disclosure relates to a multilayer RRAM cell and a multilayer RRAM module.

2. Description of Related Art

RRAM has recently gained tremendous popularity due to its fast resistance switching while consuming low power. A key advantage of RRAM has been its ability to operate at lower operation current compared to other new nonvolatile memory candidates, such as phase-change memory (PCM). The operation current of RRAM is directly related to the cross-section area but to the input currents ($I_{SET}$ and $I_{RESET}$) during the initial filament forming operation (SET operation) and the subsequent initial filament rupture operation (RESET operation). In order to reduce operation current of RRAM, the minimum resistance of the RRAM must be increased to an appropriate level.

Figure 1:
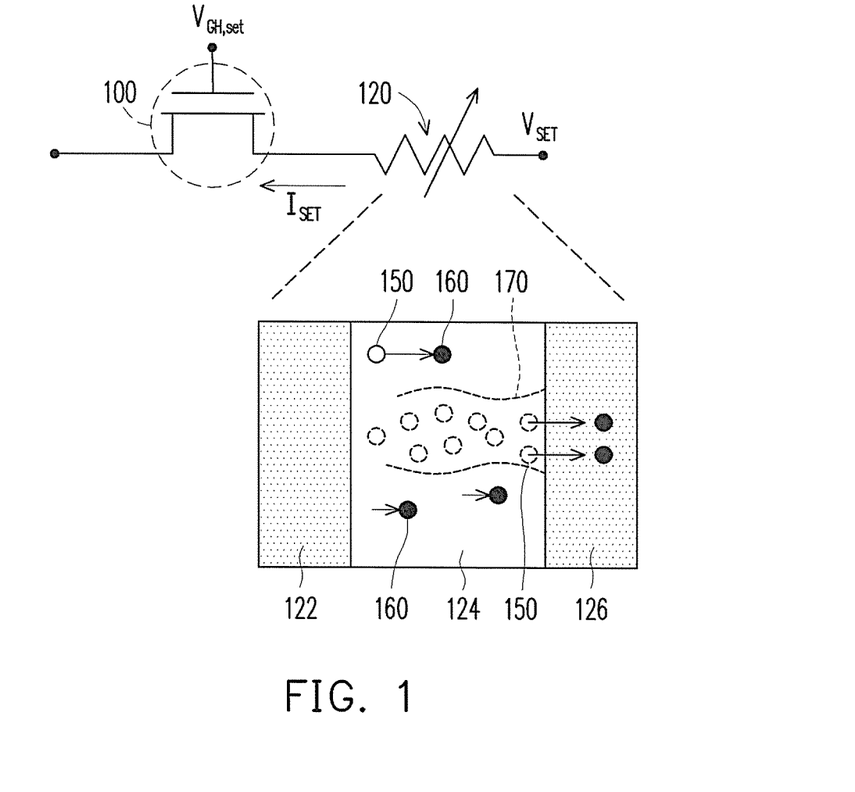
FIG. 1 is a circuit diagram illustrating an oxide-based RRAM during SET operation.
Figure 2:
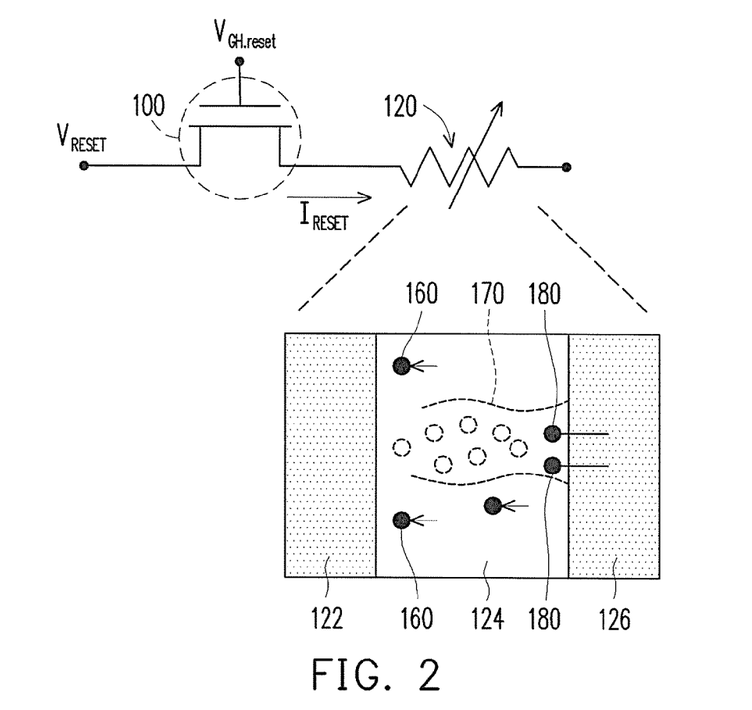
FIG. 2 is a circuit diagram illustrating an oxide-based RRAM during RESET operation.

FIG. 1 is a circuit diagram illustrating an oxide-based RRAM during SET operation, FIG. 2 is a circuit diagram illustrating an oxide-based RRAM during RESET operation. Referring to FIG. 1, the oxide-based RRAM 120 is electrically connected to a transistor 100. During the SET operation, a first voltage $V_{GH,set}$ is applied to turn on the transistor and a SET voltage $V_{SET}$ is applied between the anode 126 and cathode 122 resulting in the displacement of oxygen ions 160 in the oxide 124, leaving oxygen vacancies 150 behind, to generate a SET current $I_{SET}$ flowing through a percolating conduction path 170 formed of such vacancies (FIG. 1). During the RESET operation, a second voltage $V_{GH,reset}$ is applied to turn on the transistor and a RESET voltage $V_{RESET}$ is applied to generate a RESET current $I_{RESET}$ flowing through the transistor and the oxide-based RRAM sequentially (FIG. 2). Recombined vacancies 180 may be generated in the low current generated filament during the RESET operation.

Figure 3:
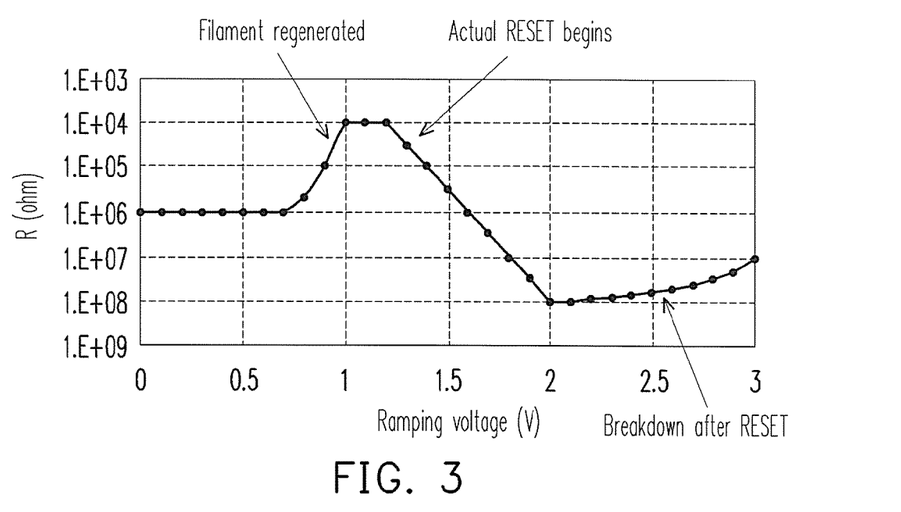
FIG. 3 is a diagram illustrating the relationship between resistance of an oxide-based RRAM and ramping voltage.

FIG. 3 is a diagram illustrating the relationship between resistance of an oxide-based RRAM and ramping voltage. It is likely that a filament generated by a low current includes a broken path fairly separated oxygen vacancies, so that during the RESET operation, the oxide between traps may actually be broken down, causing a SET operation (i.e. filament re-generation) instead of RESET operation. As shown in FIG. 3, this inadvertent SET operation leads to a reduction of resistance of RRAM. Owing to the fact that the filament extends over a distance (e.g. 5-10 nm) less than the electron mean free path (>20 nm), the electron in the regenerated filament has ballistic transport, and therefore the filament is of low resistance (at least $1/G_0=1/(2e^2/h)\sim 13$ k-ohm, where e is the electron charge, and h is Planck's constant.). During RESET operation, the input current ($I_{RESET}$) must rise to value equal to the RESET voltage ($V_{RESET}$) divided by resistance of this filament. For this example, for a RESET voltage ($V_{RESET}$) of 1.3V, the RESET current ($I_{RESET}$) rises to ~100 µA. Ramping the voltage further, the actual RESET process begins, to be followed by progressive breakdown at an excessive voltage (above 2 V in this case). Due to this undesired effect, the reduction of operation current of RRAM below 100 µA may not be possible when RESET operation is performed, as the RESET voltage ($V_{RESET}$) is continually ramped.

In a thicker film, the mean free path may be less than the thickness, and so there is no ballistic transport. However, thicker films have generally been avoided due to their much larger forming voltage (i.e. SET voltage, $V_{SET}$).

It is possible to operate RRAM at extremely low currents (<µA) and consequently also very high SET state resistance. However, in this case, the SET operation may not produce well-defined filaments. As a result, simply operating RRAM by brute force ultra-low currents may not be satisfactory.

SUMMARY

The present disclosure provides a multilayer RRAM cell and a RRAM module.

The present disclosure provides a RRAM cell including a first electrode, a second electrode, and a plurality of repeated sets of layers is provided. Each of the sets of layers includes a resistance-changing layer, a barrier layer, and an ionic exchange layer between the resistance-changing layer and the barrier layer, wherein a thickness of each of the resistance-changing layer, the barrier layer and the ionic exchange layer exceeds a Fermi wavelength, and the thickness of each of the resistance-change layer and the ionic exchange layer is less than an electron mean free path.

The present disclosure provides a resistive random access memory module (RRAM module) electrically coupled to a SET voltage and a RESET voltage is provided. The RRAM module includes a switch electrically coupled to the RESET voltage and the aforesaid RRAM cell, wherein the first electrode is electrically coupled to a bit line, the second electrode is electrically coupled to the switch, a resistance of the repeated sets of layers of the RRAM cell is R1, a resistance of the switch is R2, and $3 \le R1/R2$ during RESET operation.

In order to the make the aforementioned and other features and advantages of the present disclosure more comprehensible, several embodiments accompanied with figures are described in detail below.

BRIEF DESCRIPTION OF THE DRAWINGS

The accompanying drawings constituting a part of this specification are incorporated herein to provide a further understanding of the disclosure. Here, the drawings illustrate embodiments of the disclosure and, together with the description, serve to explain the principles of the disclosure.

DESCRIPTION OF EMBODIMENTS

In order to prevent the inadvertent SET operation described in connection with FIG. 3, this disclosure provides a novel structure of the RRAM cell having high resistance. Instead of increasing LRS value and lowering RESET current by reducing the SET current to form a broken filament, this disclosure stacks a plurality of repeated sets of layers to obtain the target resistance.

Figure 4:
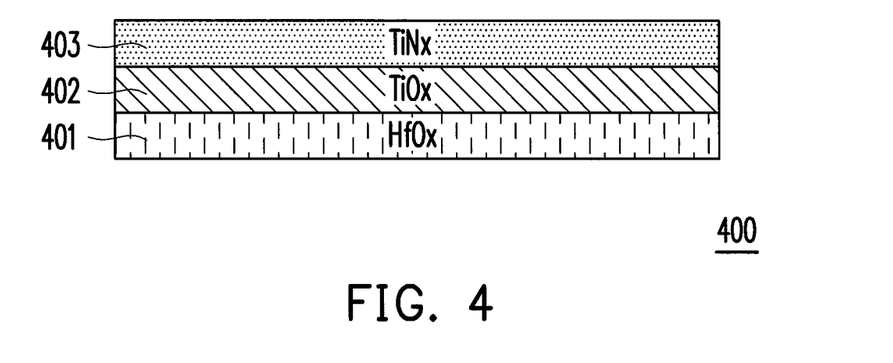
FIG. 4 schematically illustrates a tri-layer that may be repeated in an embodiment in the disclosure.

FIG. 4 schematically illustrates a key feature of the RRAM of an embodiment in the disclosure. The RRAM of this embodiment includes a plurality of repeated sets of layers 400. Each of the sets of layers 400 includes a resistance-changing layer 401 (e.g., HfOx), a barrier layer 403 (e.g., TiN), and an ionic exchange layer 402 (e.g., TiOx) between the resistance-changing layer 401 and the barrier layer 403, wherein a thickness of each of the resistance-changing layer 401, the barrier layer 403, and the ionic exchange layer 402 exceeds the Fermi wavelength (i.e. the deBroglie wavelength corresponding to the Fermi energy). For typical metals or oxides, the Fermi energy is in the range of 7~10 eV, and the corresponding deBroglie wavelength (Fermi wavelength) is in the range of 0.4~0.5 nm. This prevents electron wavefunctions from blurring boundaries and interfaces between layers (i.e. the resistance-changing layer 401, the barrier layer 403 and the ionic exchange layer 402).

Additionally, to ensure ballistic transport, the thickness of each of the resistance-changing layer 401 and the ionic exchange layer 402 is less than electron mean free path. For energies of 2 eV or less above Fermi level, the mean free path is well above 10 nm (L. C. Feldman and J. W. Mayer Fundamentals of Surface and Thin Film Analysis, p. 129). The barrier layer 403 prevents mixing of layers between each set 130 and also quantum mechanically decoheres the electron, so that the ballistic transport is only counted between the barrier layers, which also serve as intermediate electrodes.

Figure 5:
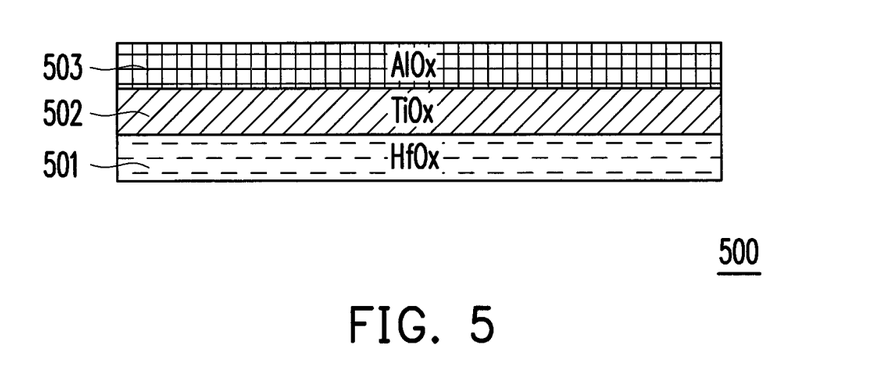
FIG. 5 schematically illustrates another tri-layer that may be repeated in another embodiment in the disclosure.

In an alternative embodiment, shown in FIG. 5, the barrier layer may not be a metal but a thin tunneling barrier layer 503, such as AlOx, which can transmit a fraction of incident electrons. The thickness of this layer is less than the mean free path, to ensure ballistic transport as well. For example, the material of the resistance-changing layer 501 is HfOx and the material of the ionic exchange layer 502 is TiOx.

Figure 6A:
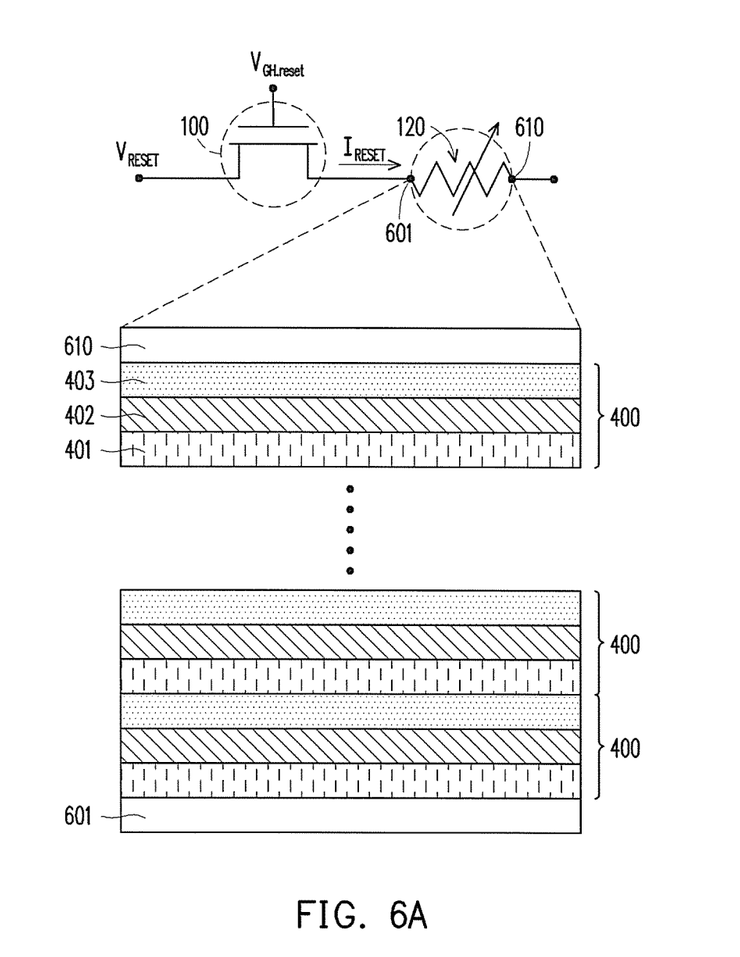
FIG. 6A shows one embodiment in the disclosure.
Figure 6B:
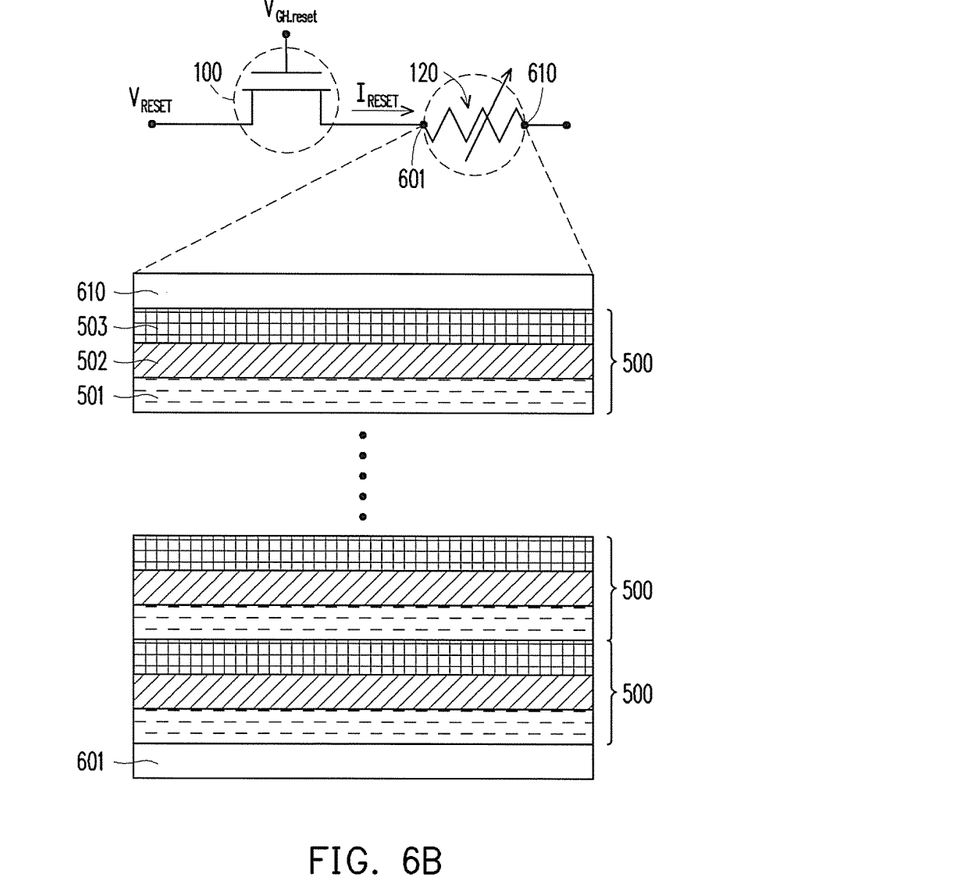
FIG. 6B shows another embodiment in the disclosure.
Figure 6C:
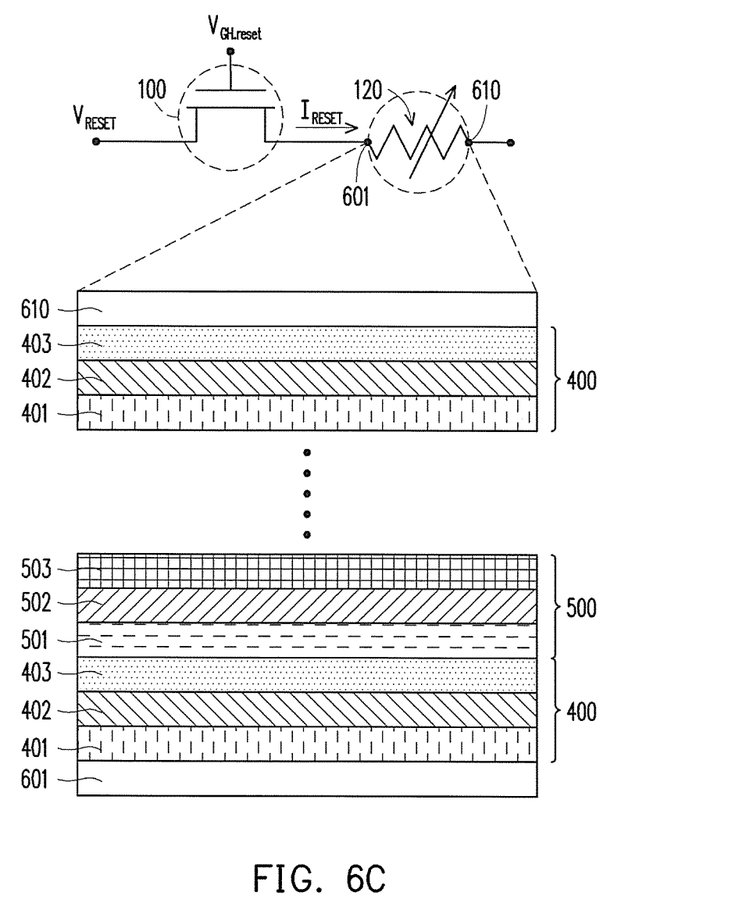
FIG. 6C shows a third embodiment in the disclosure.

FIGS. 6A, 6B, and 6C show three different embodiments of the RRAM in this disclosure. In FIG. 6A, the conductor barrier/ion exchange layer/resistance-change layer 400 is repeated, each repetition adding at least 1/G0~13 K-ohm to the minimum resistance, where G0 is the quantum unit of conductance $2e^2/h$, where e is the electron charge, and h is Planck's constant. In a typical example of this case, the material of the resistance-changing layer 401 is HfOx, the material is the barrier layer 403 is TiNx, and the material of the ionic exchange layer 402 is TiOx, for example. In addition, the thickness of the resistance-changing layer 401 is about 1~2 nm, the thickness of the barrier layer 403 is about 1~2 nm, and the thickness of the ionic exchange layer 402 is about 1 nm. The total thickness of one set of layers 400 is therefore about 3~5 nm. When the number of the repeated sets of layers 130 is 10, the total thickness of the repeated sets of layers 130 is about 30~50 nm, which exceeds the electron mean free path. When the barrier layer 403 is a metal with well-defined Fermi level or chemical potential, the repeated sets of layers 400 allow the resistance thereof to increase above ~130 K-ohms and the corresponding RESET current can be under 10 μA.

In an embodiment, the resistance-changing layer 401 and the ionic exchange layer 402 can substantially be the same material, but with different stiochiometries. The barrier layer 403 is conductive and serves as electron reservoir. The barrier layer 403 is capable of scattering electrons due to its grain boundary and roughness. Additionally, the barrier layer 403 is capable of preventing each of the ionic exchange layers 402 from reacting with more than one resistance-changing layer 401. Specifically, each of the ionic exchange layers 402 is sandwiched between and in contact with one resistance-changing layer 401 and one barrier layer 403.

The material of the first electrode 601 and the second electrode 610 is proposed to use relatively inert materials. In this embodiment, the material of the first electrode 601 and the second electrode 610 is TiNx, for example. It is noted that, the first electrode 601 and the second electrode 610 do not interact with the repeated sets of layers 400. Only the internal ion exchange (e.g. oxygen vacancies of HfOx) in the resistance-changing layer 401 should be utilized for the resistance switching.

FIG. 6B schematically illustrates the RRAM of another embodiment in the disclosure. In this embodiment, the tunnel barrier/ion exchange/resistance-change layer 500 is repeated. The AlOx barrier layer 503 is capable of preventing mixture of other layers (i.e. the resistance-changing layer 501 and the ionic exchange layer 502). In addition, the AlOx barrier layer 134' is at least partially electron transmitting.

In this embodiment, the thickness of each of the resistance-changing layer 501, the barrier layer 503 and the ionic exchange layer 502 must be less than electron mean free path but exceeds the Fermi wavelength, to preserve the ballistic transport. For example, the thickness of the resistance-changing layer 501 is about 1.5~3 nm, the thickness of the barrier layer 503 is about 2~4 nm, and the thickness of the ionic exchange layer 502 is about 1~3 nm. The total thickness of one set of layers 500 is about 4.5~10 nm, for example. When the number of the repeated sets of layers 500 is large enough, e.g., 10, the total thickness of the repeated sets of layers 500 is about 45~100 nm, which well exceeds the electron mean free path.

FIG. 6C shows the embodiment where the repeated layers may actually be a mixture or combination of 400 and 500. It is noted that the material of the ionic exchange layer 402 and that of the ionic exchange layer 502 may be identical or different from each other. In addition, the material of the resistance-changing layer 401 and that of the resistance-changing layer 501 may be identical or different from each other.

Figure 7A:
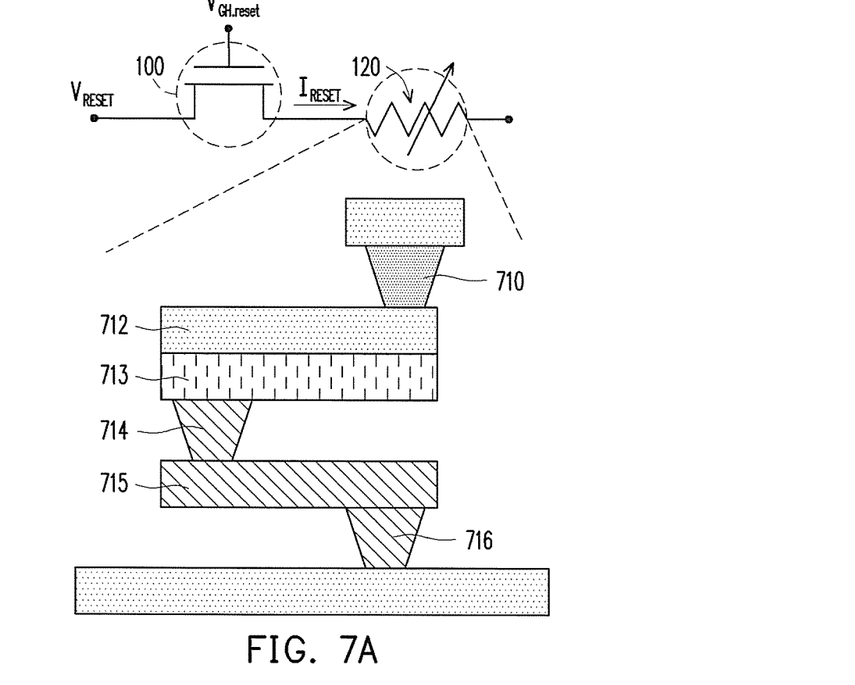
FIG. 7A shows a cross section of a fourth embodiment in the disclosure.
Figure 7B:
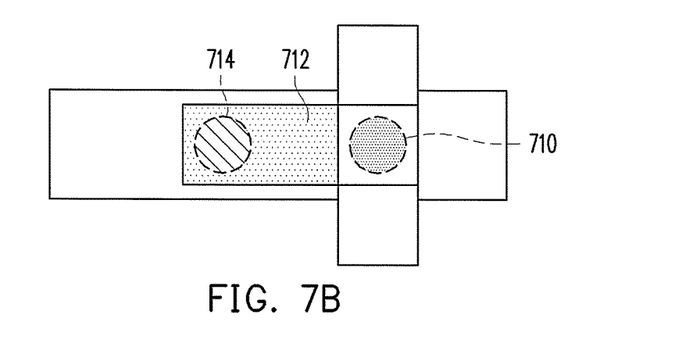
FIG. 7B shows a top view of a fourth embodiment in the disclosure.

In a fourth embodiment, shown in FIGS. 7A and 7B, the issue of ballistic transport is avoided altogether by deliberately putting a twist in the conduction path outside the resistance-changing material 713 and ionic exchange region located in a contacting feature 714 adjacent the resistance-changing material 713. Furthermore, this twisted path is constructed in a resistive buffer material 715, such as Si or TiOx, whose resistance is also controlled by the voltage across it. When the voltage across the buffer is large enough, the current through the resistance-changing material is sufficient to carry out the SET or RESET operation at a reduced level. The thickness of this material is also thinner than the bulk mean free path of the material. The thickness therefore becomes the new, greatly reduced mean free path, and so the resistance of the twisted path is sufficiently high to limit the RESET current as well as the voltage applied to the resistance-changing material. The resistance is deliberately enhanced with the distance between the contacting feature 714 and substrate contact 716, as well as between the contacting feature 714 and the contact 710 from the bit line to the top electrode 712.

In aforesaid embodiments of this disclosure, by stacking multiple pairs of resistance-changing layer/ionic exchange layer in series, the pairs of resistance-changing layer/ionic exchange layer are separated by inert, conductive, scattering barrier layers. In those aforesaid embodiments of this disclosure, not only the RESET current can be reduced, but also the forming voltage can be reduced.

Although the present disclosure has been disclosed above by the embodiments, they are not intended to limit the present disclosure. Anyone skilled in the art can make some modifications and alteration without departing from the spirit and scope of the present disclosure. Therefore, the protecting range of the present disclosure falls in the appended claims.

What is claimed is:

1. A resistive random access memory module (RRAM module) electrically coupled to a RESET voltage, the RRAM module comprising:
    a switch electrically coupled to the RESET voltage; and
    a resistive random access memory cell (RRAM cell) comprising a first electrode, a second electrode, and a plurality of repeated sets of layers, each of the sets of layers comprising a resistance-changing layer, a barrier layer, and an ionic exchange layer between the resistance-changing layer and the barrier layer, where the thickness of each of the resistance-changing layer, the barrier layer and the ionic exchange layer exceeds a Fermi wavelength, and the thickness of the resistance-changing layer and the ionic exchange layer are each less than an electron mean free path, the first electrode being electrically coupled to the switch, wherein a resistance of the repeated sets of layers of the RRAM cell is R1, a resistance of the switch is R2, and $3 \leq R1/R2$ during RESET operation.

2. The RRAM module of claim 1, where the thickness of at least one of the barrier layers is less than an electron mean free path.

3. The RRAM module of claim 1, wherein the first electrode and the second electrode do not interact with the repeated sets of layers.

4. The RRAM module of claim 1, wherein a material of the resistance-changing layer comprises HfOx.

5. The RRAM module of claim 1, wherein a material of the barrier layer comprises TiN or AlOx.

6. The RRAM module of claim 1, wherein a material of the ionic exchange layer comprises TiOx.

7. The RRAM module of claim 1, wherein the resistance-changing layer and the ionic exchange layer are substantially the same material, but with different stiochiometries.

8. The RRAM module of claim 1, wherein the barrier layer is conductive and scatters electrons.

9. The RRAM module of claim 1, wherein a material of the first electrode comprises TiNx.

10. The RRAM module of claim 1, wherein a material of the second electrode comprises TiNx.

11. The RRAM module of claim 1, wherein a total thickness of the repeated sets of layers exceeds an electron mean free path.

12. A resistive random access memory (RRAM) cell, comprising:
    a first electrode;
    a second electrode;
    a plurality of repeated sets of layers, each of the sets of layers comprising:
        a resistance-changing layer;
        a barrier layer; and
        an ionic exchange layer between the resistance-changing layer and the barrier layer, wherein a thickness of each of the resistance-changing layer, the barrier layer and the ionic exchange layer exceeds a Fermi wavelength, and the thickness of each of the resistance-change layer and the ionic exchange layer is less than an electron mean free path.

13. The RRAM cell of claim 12, where the thickness of at least one of the barrier layers is less than an electron mean free path.

14. The RRAM cell of claim 12, wherein the first electrode and the second electrode do not interact with the repeated sets of layers.

15. The RRAM cell of claim 12, wherein a material of the resistance-changing layer comprises HfOx.

16. The RRAM cell of claim 12, wherein a material of at least one of the barrier layer comprises TiN or AlOx.

17. The RRAM cell of claim 12, wherein a material of the ionic exchange layer comprises TiOx.

18. The RRAM cell of claim 12, wherein the resistance-changing layer and the ionic exchange layer are substantially the same material, but with different stiochiometries.

19. The RRAM cell of claim 12, wherein the barrier layer is conductive and scatters electrons.

20. The RRAM cell of claim 12, wherein a material of the first electrode comprises TiNx.

21. The RRAM cell of claim 12, wherein a material of the second electrode comprises TiNx.

22. The RRAM cell of claim 12, wherein a total thickness of the repeated sets of layers exceed electron mean free path.

23. A resistive random access memory (RRAM) cell, comprising:
    a top electrode;
    a bottom electrode;
    a resistance-changing layer in contact with the top electrode;
    a contact to the resistance-changing layer containing a region of ionic exchange with the resistance changing layer;
    a resistive buffer layer comprising a material whose resistance is dependent on the voltage applied from one end to the other, whose thickness is less than a bulk electron mean free path, in contact with the contact to the resistance-changing layer;
    a contact to the resistive buffer layer located at the opposite end from the contact to the resistance-changing layer, and contacting the bottom electrode.

24. The RRAM cell of claim 23, where the resistive buffer is made of silicon.

25. The RRAM cell of claim 23, where the resistive buffer is made of TiOx.

26. The RRAM cell of claim 23, where the resistive buffer and the contacts to it are made of the same material.

* * * * *